US010495537B2

(12) United States Patent
Trost

(10) Patent No.: US 10,495,537 B2
(45) Date of Patent: Dec. 3, 2019

(54) CASE FOR A PORTABLE ELECTRONIC DEVICE WITH AN INTEGRATED TIRE PRESSURE SENSOR, TREAD DEPTH METER, AND TRANSCEIVER

(71) Applicant: Dana Heavy Vehicle Systems Group, LLC, Maumee, OH (US)

(72) Inventor: Harry W. Trost, Royal Oak, MI (US)

(73) Assignee: Dana Heavy Vehicle Systems Group, LLC, Maumee, OH (US)

( * ) Notice: Subject to any disclaimer, the term of this patent is extended or adjusted under 35 U.S.C. 154(b) by 162 days.

(21) Appl. No.: 15/903,356

(22) Filed: Feb. 23, 2018

(65) Prior Publication Data

US 2018/0238760 A1 Aug. 23, 2018

Related U.S. Application Data

(60) Provisional application No. 62/462,745, filed on Feb. 23, 2017.

(51) Int. Cl.
| | |
|---|---|
| *B60C 23/00* | (2006.01) |
| *G01L 17/00* | (2006.01) |
| *H05K 5/00* | (2006.01) |
| *G01B 5/18* | (2006.01) |
| *G01B 3/28* | (2006.01) |
| *B60C 23/04* | (2006.01) |

(52) U.S. Cl.
CPC .......... *G01L 17/00* (2013.01); *B60C 23/0479* (2013.01); *G01B 3/28* (2013.01); *G01B 5/18* (2013.01); *H05K 5/0086* (2013.01)

(58) Field of Classification Search
CPC combination set(s) only.
See application file for complete search history.

(56) References Cited

U.S. PATENT DOCUMENTS

| 3,177,724 | A | * | 4/1965 | Trinca ................. B60C 23/0496 73/431 |
|---|---|---|---|---|
| 8,067,848 | B1 | | 11/2011 | Vilsaint |
| 8,736,435 | B2 | | 5/2014 | Kanenari |
| 9,050,862 | B2 | | 6/2015 | Mouchet |
| 9,736,669 | B2 | | 8/2017 | Frye et al. |
| 9,844,984 | B2 | | 12/2017 | Elnajjar |
| 2003/0187556 | A1 | | 10/2003 | Suzuki |
| 2013/0145834 | A1 | * | 6/2013 | Mouchet ............. B60C 23/0479 73/146.4 |
| 2015/0008248 | A1 | | 1/2015 | Giordano et al. |
| 2015/0148634 | A1 | * | 5/2015 | Garudadri .......... A61B 5/02141 600/323 |
| 2017/0246916 | A1 | | 8/2017 | Rhodes |
| 2018/0003593 | A1 | * | 1/2018 | Siegel .................... B60C 11/246 |
| 2019/0019335 | A1 | * | 1/2019 | Elangovan ............ G06T 19/006 |

* cited by examiner

*Primary Examiner* — Andre J Allen
(74) *Attorney, Agent, or Firm* — Marshall & Melhorn, LLC

(57) ABSTRACT

Provided herein is a case for an portable electronic device, the case including: a shell having a first side wall, a second side wall, a top wall and a bottom wall, wherein the top and bottom walls connect the side walls and define a cavity; a plurality of apertures extending through the walls of the shell; a tire pressure gauge connected to and extending from the shell; a tread depth meter connected to and extending from the shell; and a wireless transceiver connected to and extending from the shell, wherein the device is received in the cavity.

20 Claims, 1 Drawing Sheet

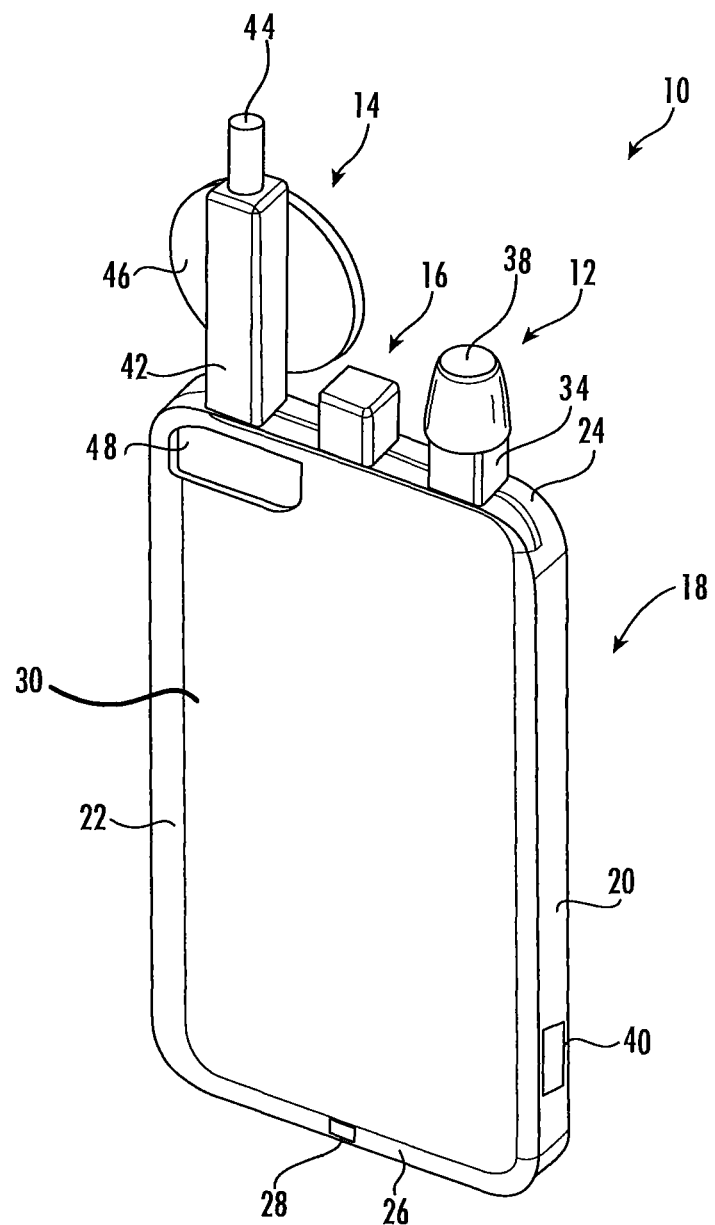

CASE FOR A PORTABLE ELECTRONIC DEVICE WITH AN INTEGRATED TIRE PRESSURE SENSOR, TREAD DEPTH METER, AND TRANSCEIVER

RELATED APPLICATION

This application claims the benefit of U.S. Provisional Application No. 62/462,745 filed Feb. 23, 2017, which is herein incorporated herein by reference.

BACKGROUND

The present device is related to measuring, transmitting and recording of vehicle data parameters. In particular, the present device is directed to a tire pressure gauge, tire tread depth meter and transceiver integrated case for a portable electronic device. More specifically, the case supports and is electrically connected to a tire pressure gauge, a tread depth gauge and transmitting device for connection with a smartphone in an integrated fashion.

Collecting data on physical parameters of a system can provide many benefits. In the area of vehicle management, data collection and analysis can save time, money, and lives. With respect to consumable items on vehicles such as tires, brakes, belts and the like, having accurate timely data on aspects of their physical parameters can help warn of impending failure of the part and can help to judge the quality of the parts. Monitoring data points can also help identify unsafe conditions in other systems secondarily related to the consumables.

Organizations with large vehicle fleets have seen the value of data collection and analysis in running the fleet efficiently and safely. As one example, collecting and analyzing the operating parameters of tires have provided great cost benefits. Incorrect tire pressure can lead to inefficient vehicle operation such as fuel waste and unnecessary tire wear but more importantly can reduce steering performance or control which can lead to costly accidents. The failure to monitor uneven or excessive tire tread wear can also lead to problems.

With the advent of smartphones and other portable electronic computing devices and the proliferation of applications that run on these systems, maintaining and analyzing data has never been more accessible, even to smaller organizations. However, maintaining a consistent and thorough system of data collection and recording still requires effort. The singular task of obtaining a tire pressure reading, a tread depth or other measurement is relatively simple. In addition, entry of multiple data points into a data application system is also relatively simple. However, the disjointed task of taking a measurement and then recording the measurement in a data application system slows the process and make it more likely that these tasks are not performed.

The task of data collection and recordation likely would be performed more consistently and diligently with the availability of more convenient tools. It would be desirable to provide a device that takes data measurements, transmits and records them directly into relevant software application. Additionally, it would be advantageous if the device is integrated with other items typically carried by relevant professionals.

SUMMARY

Provided herein is a case for an portable electronic device, the case including: a shell having a first side wall, a second side wall, a top wall and a bottom wall, wherein the top and bottom walls connect the side walls and define a cavity; a plurality of apertures extending through the walls of the shell; a tire pressure gauge connected to and extending from the shell; a tread depth meter connected to and extending from the shell; and a wireless transceiver connected to and extending from the shell, wherein the device is received in the cavity. In some embodiments, the first side wall, second side all, top wall and bottom wall are u-shaped and define channels, wherein the channels are configured to receive the device. In some embodiments, the case further includes a port, wherein the port is in electronic communication with the tire pressure gauge, tread depth meter and wireless transceiver. In some embodiments, the port is configured to directly electronically communicate with the device to transmit data. In some embodiments, the first side wall, second side will, top wall and bottom wall have a thickness larger than the width of the device. In some embodiments, the shell is a single integral piece composed of an elastomeric material. In some embodiments, the first side wall, second side wall, top wall and bottom wall are separate pieces connected to together. In some embodiments, the shell is composed of metal, plastic, ceramic, or polymer. In some embodiments, the caser further includes a substantially planar surface connecting the first side wall, the second side wall, the top wall and the bottom wall to each other. In some embodiments, the port is positioned on the bottom wall of the shell. In some embodiment, the case further includes a plurality of wires extending from the tread depth meter, the tire pressure gauge and the transceiver to the port. In some embodiments, the case further includes an auxiliary port positioned on the shell, the auxiliary port configured to interface with a vehicle computer access plugs or ports. In some embodiments, the auxiliary port is electrically connected to the port. In some embodiments, the tire pressure gauge is an electronic tire pressure gauge that outputs an electrical signal corresponding to a measured air pressure. In some embodiments, the tire pressure gauge, the tread depth meter and the transceiver extend from the top wall of the shell. In some embodiments, the tire pressure gauge includes a body portion and a fitting mounted to the body portion, wherein the body portion houses a plurality of digital and/or analog components of the tire pressure gauge. In some embodiments, the transceiver is configured to communicate with an internal wireless communication system of the device. In some embodiments, the tread depth meter is an electronic tread depth meter that outputs an electrical signal corresponding to the depth or length of the tread as measured. In some embodiments, the tread depth meter includes a base portion and a spring biased pin that extends from the base portion, wherein the base portion houses the digital and/or analog components of the tread depth meter. In some embodiments, the tread depth meter includes a wireless transmitter is in electronic communication with the transceiver and the port.

BRIEF DESCRIPTION OF THE DRAWINGS

Novel features are set forth with particularity in the appended claims. A better understanding of the features and advantages of the embodiments will be obtained by reference to the following detailed description that sets forth illustrative embodiments, in which the principles of the embodiments are utilized, and the accompanying drawings of which:

FIG. 1 is a perspective view of one preferred embodiment of a case.

DETAILED DESCRIPTION OF THE PREFERRED EMBODIMENTS

It is to be understood that the invention may assume various alternative orientations and configurations, except where expressly specified to the contrary. It is also understood that the specific devices and processes illustrated in the attached drawings, and described in the specification are simply exemplary embodiments of the inventive concepts disclosed and defined herein. Therefore, specific dimensions, directions or other physical characteristics relating to the various embodiments disclosed are not to be considered as limiting, unless expressly stated otherwise.

Provided herein is a case for a portable electronic device, the case including integrated sensors/gauges that communicate with the portable electronic device.

Portable electronic devices with which the protective case may be used include, but are not limited to, cellular smartphones, personal digital assistants (PDAs), tablet computers, portable music devices, portable television devices, portable movie player devices, portable Internet devices, and so on.

FIG. 1 depicts one embodiment of a case 10. The case 10 generally includes an outer shell 18 shaped to define a space to receive and hold a portable electronic device. In particular, the shell 18 is shaped to protect the portable electronic device while still allowing a user to access the device to operate the device.

As depicted in FIG. 1, the case 10 is shaped for use with a portable electronic device that is a smartphone.

Particularly, as shown in FIG. 1, in some embodiments, the case 10 has four connected walls 20, 22, 24, 26 forming a shell 18 encircling the edges of the device and effectively holding the device.

In some embodiments, the device is maintained in contact with the case 10 through friction; however, an adhesive or fastener can also be used.

In some embodiments, the shell 18 is substantially rectangular and includes spaced apart and substantially parallel upstanding side walls 20, 22, a top wall 24 and a bottom wall 26. The top and bottom walls 24, 26 connect the side walls 20, 22.

In some embodiments, the walls 20, 22, 24, 26 are u-shaped to provide channels 34 that receives the edges of the device.

The shell 18 includes a plurality of apertures in the walls 20, 22, 24, 26 that align with ports and control features of the device to allow a user to access the ports an controls of the device while the case in on the device.

In some embodiments, the shell 18 includes a plurality of indentations or shapes that align with and fit to control features, for example an on/off button, of the device allowing a user to activate the control features while the case 10 remains on the device.

In some embodiments, the walls 20, 22, 24, 26 are a single integral piece composed of an elastomeric material to allow it to be stretched over the device and retract to provide a tight fit.

In some embodiments, the shell 18 is composed of separate pieces, each piece including the walls 20, 22, 24, 26 or portions thereof, that are connected to each other via a screw or other mating feature, and so on, to form the shell 18. For examples, the walls 20, 22, 24, 26 can be connected together in a locking fashion around the device.

In some embodiments, the case 10 is made of a hard, rigid material such as a metal, plastic, ceramic, or polymer.

In some embodiments, the case 10 is made of a pliable material such as rubber, soft plastic or polymer.

It will also be appreciated that in some embodiments, one or of the walls 20, 22, 24 26 may be omitted in certain designs to allow for easier access and/or insertion of the device in the case.

In some embodiments, the walls 20, 22, 24, 26 of the case 10 are wider than the thickness of the device to provide spacing between the device and a surface when the device and case 10 are laid flat.

In some embodiments, the case 10 includes a substantially planar back surface 30 connecting walls 20, 22, 24, 26 to each other providing protection to the back of the device.

In some embodiments, the case 10 includes a substantially planar front surface 32 connecting walls 20, 22, 24, 26 to each other providing protection to the front of the device In some embodiments, the case 10 the front or back surface 32, 30 is a clear plastic film or cover extending between the walls 20, 22, 24, 26 to provide protection for the front or back of the device while still allowing the user to see a display on the front or back of the device.

In some embodiments, the front or back surface 32, 30 include an aperture 48 that aligns with a camera lens of the portable electronic device.

The case 10 includes at least on sensor/gauge integrated into the case 10.

In some embodiments, include multiple sensors/gauges including, but not limited to, a tire pressure gauge 12, a tread depth meter 14 and a wireless transceiver or transceiver 16.

In some embodiments, the case 10 includes a data interface plug or port 28. The port 28 is configured to electronically communicate with a port of the device to transmit and receive data therewith. In some embodiments, port/plug 28 is a lightning plug to be directly connected to the device to communicate therewith.

In some embodiments, the port 28 is positioned on the bottom wall 26 for engagement with a data port of the smartphone. However, since placement of the smartphone data port can vary among portable electronic device manufacturers, plug or port 28 and be placed on any of the walls 20, 22, 24, 26 to be compatible with all devices.

In some embodiments, the port 28 is electrically connected or wired to communicate with each of the sensors/gauges including the tire pressure gauge 12, tread depth meter 14 and wireless transceiver 16.

In some embodiments, the case 10 includes wires or Connections (not shown) that run along or within the walls 20, 22, 24, 26 of the case, connecting the port 28 to the sensors/gauges 12, 14, 16.

In some embodiments, the case 10 includes a separate auxiliary port or plug 40 positioned on any one of the walls 20, 22, 24, 26. The auxiliary port 40 can interface with vehicle computer access plugs or ports to download data collected by the sensors/gauges to a vehicle data management system.

In some embodiments, the auxiliary port 40 is electrically connected to port 28.

In some embodiments, the case 10 communicates with an application or software built into the portable electronic device or the vehicle via ports 28, 40.

In some embodiments, the case 10 communicates with an application or software built into the portable electronic device or the vehicle via the wireless transceiver 16.

FIG. 1 depicts one embodiment of a tire pressure gauge 12 integrated into the case.

In some embodiments, the pressure gauge 12 is an electronic tire pressure gauge that outputs an electrical signal corresponding to the measured air pressure; however, other known pressure gauges can be used.

The pressure gauge 12 is connected to and extends from any one of the walls 20, 22, 24, 26.

In some embodiments, as shown in FIG. 1, the pressure gauge 12 extends from top wall 24.

In some embodiments, the pressure gauge 12 includes a body 34 portion that houses digital and/or analog components of the pressure gauge 12. Mounted to the body 34 is a universal or common fitting 38 for interfacing with tire valves.

In some embodiments, a display (not shown) of the measure pressure is included with the pressure gauge or the output of the gauge 12 can be displayed on the device.

To take a tire pressure measurement using the pressure gauge 12, fitting 38 is placed over a tire valve and the pressure gauge 12 pushed or urged towards the tire to engage the valve stem of the tire and causes air to flow through the stem and to the pressure gauge 12. The air pressure can be measured using the gauge 12 and the data transmitted to the device through the wired case 10 or the wireless transceiver 16.

In some embodiments, software applications installed in the portable electronic device can be configured to accept the output signals of the pressure gauge 12 and to display the measured tire pressure on the device.

In some embodiments, the software application includes configuration options to select the units of the pressure value and to store the measured pressure for further data manipulation by the software or to transfer the value for use by other software applications or data storage.

In some embodiments, the signal outputted by pressure gauge 12 is transferred via the wired connections from the pressure gauge 12 through the port or plug 28 to the data port of the device.

Alternatively, the pressure gauge 12 can have a wireless transmitter that communicates with the device's preexisting internal wireless communication transceivers or with wireless transceiver 16 which connects via port or plug 28 with the device.

FIG. 1 depicts one embodiment of a tire tread depth meter 14 integrated into the case 10.

In some embodiments, the tread depth meter 14 is an electronic tread depth meter gauge that outputs an electrical signal corresponding to the depth or length of the tread as measured; however, other known pressure gauges can be used.

In some embodiments, the tire tread depth meter 14 is connected to and extends from any one of the walls 20, 22, 24, 26. In the embodiment shown, tread depth meter 14 can extend from top wall 24.

In some embodiments, the tread depth meter 14 includes a base portion 42 housing the digital and/or analog components of the tread depth meter 14. A spring biased pin 44 extends from base portion 42 for taking tread depth measurements. In order to take a tread depth measurement, a pin 44 is inserted into a tread of the tire and pushed towards the tire. The pushing force caused the pin 44 to retract against the spring biasing force until a stop member 46 makes contact with the tire. The distance travelled by the pin 44 represents the tread depth which can be converted into a digital or electrical signal for output to the device. A display can be included with on the tread depth meter 14 or the output can be displayed on the device.

In some embodiments, the device through installed software application is configured to accept the output of the tread depth meter 14 to display the measured tread depth.

The software can also include configuration options to select the units of the depth value and to store the measured value for further data manipulation by the software or to transfer the value for use by other software applications or data storage.

In some embodiments, the signal outputted by tread depth meter 14 is transferred via hard wire connections from the meter 14 through the port or plug 28 to the data port of the device.

Alternative, in some embodiments, the depth meter 14 includes a wireless transmitter that communicates with the device's preexisting internal wireless communication transceivers or with wireless transceiver 16 that connects via port or plug 28 with the device.

As shown in FIG. 1, in some embodiments, the wireless transceiver 16 is integrated into the case 10 and is a combination transmitter and transceiver well known in the art. The transceiver 16 can transmit and receive signals under a variety of protocols and technologies.

In some embodiments, the transceiver 16 is connected to and extends from any one of the walls 20, 22, 24, 26.

In some embodiments, the transceiver 16 transmits and receives WI-FI, Bluetooth and RFID signals or any other wireless communication network and is compatible with multiple standards such as IEEE 802.11.

The transceiver 16 picks up signals transmitted within near proximity and originating from the pressure gauge 12, tread depth meter 14 or other compatible gauges or meters. Signals received by the transceiver 16 can then be transferred to the device through either the hard wired port or plug 28 or through wireless communication with any preexisting or included internal wireless communication devices of the device itself.

In some embodiments, the case 10 includes embedded software that may be installed to the device once the plug 28 is connected to the device data port to provide other code to allow the device to operate the integrated pressure gauge 12, tread depth meter 14 and wireless transceiver 16.

A variety of software can be configured to work specifically with case 10 including, but not limited to, software for tracking tire pressure and tread depth data collected through use of the sensors/gauges.

In some embodiments, a user can launch an application on the device which is connected to case 10 via plug 28 that interfaces with the data port of the device. The user can then select to a data measurement to be collected. Once the measurement is selected and relevant tire identification is entered into the application using the device allowing the user to identify the tire (e.g. front, rear, drive side, passenger side etc.) to be measured on the software. The software then awaits signal or data from the sensor/gauge. After the user collects the data using the gauges/sensors, the data is automatically transferred, stored and recorded to the device memory and inputted in a data management portion of the software without any additional action on the part of the user. The process can be repeated for the remaining tires or data points needed. The software can then manipulate the data to provide report and forecasts and other information for the vehicle, tire, and/or a fleet of vehicles.

In some embodiments, the case 10 is configured to communicate with wireless enabled tire pressure valves and caps. Tire valves or valve caps that include air pressure sensing capabilities are also outfitted with wireless transmitters. Such valves or valve caps can transmit a low pressure warning when low pressure is sensed and may even transmit real-time or current air pressure values periodically or when accessed by appropriate signals. Such valves can transmit using many different protocols such as, but not limited, to Bluetooth®, RFID and WI-FI protocols. The transceiver 16 can receive the signals from the valves/caps and communicate the data to the device or the vehicle through the wired/wireless communication devices of the case 10.

A user can launch software for recording tire pressure measurements. After entering any preliminary identifying information, the user can select the tire to take a pressure reading. The software can then activate the wireless transceiver 16 to communicate with the wireless tire valve or cap to obtain a reading. The reading may also occur automatically upon proximity between the case and the wireless valve or cap. Alternatively, the internal preexisting wireless transceiver of the device may interact with the wireless valve or cap. The measurement data can then be recorded, stored in memory and inputted into the software's data management. The software can then manipulate the data to provide report and forecasts and other information for the vehicle, tire, and/or a fleet of vehicles.

The case 10 can also be adapted with software to record and manage data produced by other sensors that may be incorporated in vehicles. For example, brake and brake systems may include temperature sensors to provide warnings of overheating or for tracking of the brakes and brake systems. Brake pads may have braking lining sensors to indicate wear and remaining lifetime of the brake lining. Batteries can have sensors monitoring the electrical parameters and performance of the battery. Weight sensors can be provided on vehicles to provide current weight information. The case 10 can communicate with these sensors, and others, through the wireless transceiver 16 wirelessly or the sensors can interface with auxiliary port 40 via vehicle computer access plugs or ports to download data.

In some embodiments, the camera of the device can be used to record images of features such as damage or defects to be included in the data management software.

The transceiver 16 can be in communication with a vehicle data management system via the transceiver and/or the devices own wireless communication system. In some embodiments, the vehicle data management system can transmit the data received from the sensors/gauges to a fleet management system.

While this invention has been described with reference to illustrative embodiments, it will be understood that this description shall not be construed in a limiting sense. Rather, various changes and modifications can be made to the illustrative embodiments without departing from the true spirit and scope of the invention, as defined by the following claims. Furthermore, it will be appreciated that any such changes and modifications would be recognized by those skilled in the art as an equivalent to one or more elements recited in the following claims, and shall be covered by such claims to the fullest extent permitted by law.

What is claimed:

1. A case for an portable electronic device, the case comprising:
   a shell having a first side wall, a second side wall, a top wall and a bottom wall, wherein the top and bottom walls connect the side walls and define a cavity;
   a plurality of apertures extending through the walls of the shell;
   a tire pressure gauge connected to and extending from the shell;
   a tread depth meter connected to and extending from the shell; and
   a wireless transceiver connected to and extending from the shell;
   wherein the device is received in the cavity.

2. The case of claim 1, wherein the first side wall, second side all, top wall and bottom wall are u-shaped and define channels, wherein the channels are configured to receive the device therein.

3. The case of claim 1, further comprising a port, wherein the port is in electronic communication with the tire pressure gauge, tread depth meter and wireless transceiver.

4. The case of claim 3, wherein the port is configured to directly electronically communicate with the device.

5. The case of claim 1, wherein the first side wall, second side will, top wall and bottom wall have a thickness larger than the width of the device.

6. The case of claim 1, wherein the shell is a single integral piece composed of an elastomeric material.

7. The case of claim 1, wherein the first side wall, second side wall, top wall and bottom wall are separate pieces connected to together.

8. The case of claim 1, wherein the shell is composed of metal, plastic, ceramic, or polymer.

9. The case of claim 1, further comprising a substantially planar surface connecting the first side wall, the second side wall, the top wall and the bottom wall to each other.

10. The case of claim 3, wherein the port is positioned on the bottom wall of the shell.

11. The case of claim 3, further comprising a plurality of wires extending from the tread depth meter, the tire pressure gauge and the transceiver to the port.

12. The case of claim 3, further comprising an auxiliary port positioned on the shell, the auxiliary port configured to interface with a vehicle computer access plugs or port.

13. The case of claim 11, wherein the auxiliary port is electrically connected to the port.

14. The case of claim 1, wherein the tire pressure gauge is an electronic tire pressure gauge that outputs an electrical signal corresponding to a measured air pressure.

15. The case of claim 1, wherein the tire pressure gauge, the tread depth meter and the transceiver extend from the top wall of the shell.

16. The case of claim 1, wherein the tire pressure gauge includes a body portion and a fitting mounted to the body portion, wherein the body portion houses a plurality of digital and analog components of the tire pressure gauge.

17. The case of claim 1, wherein the transceiver is configured to communicate with an internal wireless communication system of the device.

18. The case of claim 1, wherein the tread depth meter is an electronic tread depth meter that outputs an electrical signal corresponding to the depth or length of the tread as measured.

19. The case of claim 1, wherein the tread depth meter includes a base portion and a spring biased pin that extends from the base portion, wherein the base portion houses the digital and analog components of the tread depth meter.

20. The case of claim 3, wherein the tread depth meter includes a wireless transmitter is in electronic communication with the transceiver and the port.

* * * * *